(12) United States Patent
Taran

(10) Patent No.: US 6,404,611 B1
(45) Date of Patent: Jun. 11, 2002

(54) SINGLE-CHIP INTEGRATED CIRCUIT MODULE

(76) Inventor: Alexsander Ivanovich Taran, 103575 Zelenograd, korp.1001, kv8, Moscow (RU)

(*) Notice: Subject to any disclaimer, the term of this patent is extended or adjusted under 35 U.S.C. 154(b) by 0 days.

(21) Appl. No.: 09/529,034
(22) PCT Filed: Mar. 1, 1999
(86) PCT No.: PCT/RU99/00005
§ 371 (c)(1), (2), (4) Date: Apr. 3, 2000
(87) PCT Pub. No.: WO00/35008
PCT Pub. Date: Jun. 15, 2000

(30) Foreign Application Priority Data

Dec. 8, 1998 (RU) .......................................... 98121770

(51) Int. Cl.[7] ............................................... H01L 23/00
(52) U.S. Cl. ........................ 361/115; 361/118; 361/688
(58) Field of Search ................................. 361/115, 100, 361/118, 688, 713, 714

(56) References Cited

U.S. PATENT DOCUMENTS

| | | | |
|---|---|---|---|
| 4,987,478 A | 1/1991 | Braun et al. ................... | 357/81 |
| 5,036,163 A | 7/1991 | Spielberger et al. ....... | 174/52.4 |
| 5,887,435 A | * 3/1999 | Morton ........................ | 361/688 |
| 5,896,037 A | * 4/1999 | Kulda et al. ................. | 324/755 |

FOREIGN PATENT DOCUMENTS

| | | | |
|---|---|---|---|
| GB | 2 072 424 | 9/1981 | .......... H01L/21/50 |
| GB | 2 292 010 | 2/1996 | .......... H01L/23/66 |
| RU | 2038648 | 6/1995 | .......... H01L/23/00 |
| RU | 2091906 | 9/1997 | .......... H01L/23/02 |

OTHER PUBLICATIONS

PCT/RU99/00054 Mar. 1, 99.

* cited by examiner

Primary Examiner—Stephen W. Jackson
(74) Attorney, Agent, or Firm—Knobbe, Martens, Olson & Bear, LLP

(57) ABSTRACT

A single-chip IC module comprises a package including a header (11) made in the form of a flat plate with vias (20) along its periphery within a predetermined coordinate grid, in which vias are fastened pins of output terminal (2), on the header is fixed a carrier (3) with an IC chip (4) and conducting paths (5) coupling metallized vias (14, 17) made in the carrier (3), ones of which vias (14) together with contact pads (1) of the chip (4) form contact assemblies (6) coupling said IC chip contact pads with the conducting paths (5) on the surface of the carrier (3), and other metallized vias (17) together with pins of the output terminals (2) disposed with gaps in the metallized vias (17) of the carrier (3) form contact assemblies (7) coupling pins of the output terminals (2) with the conducting paths (5) on the surface of the carrier (3). Elements of the contact assemblies (6, 7) are coupled to each other by an electric-conductive binder (16, 19). The carrier (3) with the chip (4) is closed by a cover (12) made in the form of a plate having in its central part a hollow for the IC chip (4) and vias (21) disposed along the cover periphery within a coordinate grid coincided with the coordinate grid of vias (20) of the header (11), the pins of the output terminals (2) being passed through those vias. The cover together with the header (11) form a closed volume for the IC chip (4), protected from external influences.

23 Claims, 5 Drawing Sheets

SINGLE-CHIP INTEGRATED CIRCUIT MODULE

RELATED APPLICATION

This application is related to the application entitled INTEGRATED CIRCUIT CHIP CARRIER, Ser. No. 09/529,019, filed on the same date.

FIELD OF THE INVENTION

The present invention relates to the development and manufacture of one of the most important component of the microelectronics equipment, namely to the single-chip integrated circuit (IC) module made in the form of a packaged IC.

BACKGROUND OF THE INVENTION

A problem of effective protection of modern IC chips from external influences is the most principal in providing a quality and reliability of the electronic equipment at manufacture, test and usage stages. This problem is solved by means of individual packaging the IC chip in a special capsule made in the form either of a monolithic package, as a rule from a plastic, or a package from various materials with a cavity for the chip. In so doing, chip contact pads are coupled electrically with output terminals built in the package, by means of which an IC mounting on a circuit board is carried out. Thus, besides protecting the chip, the package with output terminals plays the role of a binding element for integrating the IC chip into the unified electrical circuit of the equipment.

Besides protecting and mounting functions, the package has to perform also thermo-dispersing element functions, since when operating as a part of the equipment the IC chips evolve a significant heat output. Moreover, at clock frequencies of more than 50 MHz for multi-terminal IC's a problem of parasitic impedances becomes actual, arising because of connecting to IC chip contact pads the package elements and topological circuit board elements having their own individual and mutual capacities and inductances unyielding to effective account and compensation and reducing at high frequencies the signal-to-noise ratio in signal exchange lines between chips being a part of a unified equipment assembly.

A growth of the integration degree and IC chip sizes, growth of the clock frequency, increase of a heat output and a contact pad number toughen requirements to characteristics of packages as means for packaging IC chips for their integration in an equipment. At present, once the IC integration degree has reached 10 and more millions transistors, the clock frequencies have come close to the borderline of 1 GHz, the chip sizes have become more than one $cm^2$, the heat output has come to tens of W, and the number of contacts exceeds 400, now a significance of package elements for IC chips has become a governing factor in a usage of IC's, and a degree of conservation of initial characteristics of an IC chip, built in it during its development and manufacture, depends on a sophistication of a single-chip module structure.

Any structure of the capsule (package) of the single-chip IC module decreases, in one extent or another, main initial chip parameters. For example, it can be listed the following estimations of decrease (deterioration) of the initial chip characteristics for the IC chip of the Pentium 266 MMX class in the Socket 7 standard package:

- in frequency characteristics—4 (i.e., the clock frequency of the chip is 266 MHz, and maximum clock frequencies outside the package on the circuit board are 66 MHz);
- in dimension characteristics—50 (i.e., the chip area is about 1 $cm^2$, and the area occupied by the single-chip module in the Socket 7 standard ceramic package on the circuit board is 50 times greater);
- in weight characteristics—100 (i.e., the chip weight is 0.5 g, and the single-chip module on the basis of the Socket 7 standard package weights 50 g);
- in price characteristics—10 (i.e., the estimation of the chip price at manufacturer is 20 $, and the seller's price of the IC in the Socket 7 ceramic package is 200 $, and taking in account all consequences of the chip characteristic weakening because of packaging, the estimation of the price coefficient can reach 100 and more).

In recent years the most wide usage for complex chips having a great integration degree is gained by cermet packages in the BGA (Ball Grid Array) standard with a system of output terminals in the form of balls on the package surface, and in the PGA (Pin Grid Array) standard with a system of output terminals in the form of pins. In so doing, the number of output terminals can ranges up to 400 and more.

BGA packages are mounted on the circuit board by means of soldering ball terminals to an array of mating contact pads on the board.

PGA packages are mounted on the circuit board using a socket with zero force, since at great number of terminals, the forces for pushing in and pulling out a great number of terminals in a common socket become comparable with forces for destroying elements of the PGA package and socket itself.

A single-chip IC module is known which is made using the PGA package, including a header from ceramic in the form of a square plate with a square hollow in the plate center intended for placing the IC chip, a hollow bottom being metallized in a chip attachment place; output terminals of a pin type disposed around the header periphery from a side of the square hollow in several rows within a predetermined coordinate grid; cross-arms with contact pads placed uniformly around the square hollow edge periphery and intended for welding conductors which one ends are welded to contact pads of the IC chip fixed in hollow bottom, and other ends are welded to contact pads of the cross-arm; a system of conductors connecting contact pads of the cross-arm with the pin type output terminals, which system is made in the form of multilayer circuit structure formed during the process of manufacturing the header and placed within the header, conductors of said structure being made from a conductive paste by screen print techniques; a cover which, after soldering, forms, along with the header, a closed volume protecting the chip and cross-arm with the wired conductors welded to the contact pads of the chip and cross-arm from an external influence. At great number of terminals, the hollow edges are formed as several benches/ floors on which the contact pads of the cross-arm are placed.

Substantially, the header is a ceramic multilayer board for one IC chip, the chip contact pads being connected to the pin type output terminals built in the header via the wire couple with the cross-arm contact pads (Е. Н. Панов. «Особенности сборки специализированных БИС на базовых матричных кристаллах»,, Москва: «Высшая школа», 1990. С.37–38, рис,15а,6) (E. N. Panov, <<Pecularities of assembling the application-specific high-intergration IC's on base array master chips>> Moscrow, <<High School>> Publishing House, 1990, pp.37–38, FIG. 15a,b—Russian).

This structure of the single-chip module ensures a good protection, including the vacuum-tightness, of the inner closed volume with the chip from external influences and also has satisfactory thermo-mechanical characteristics (a resistance to raised temperatures and thermal cycles, a high mechanical strength) and a heat conductivity of ceramic details, which allows to perform a packaging of great chips with a high heat release.

With the indicated advantages, in the process of employing packages of such structure the following disadvantages take place: relatively great weight and sizes; a raised coefficient of thermal expansion, which leads, at great package dimensions, to difficulties in matching thermo-mechanical parameters of elements of the package and circuit board; high complexity and labor content in manufacturing the package, and also in mounting the chip and welding contact pads onto the cross-arm; a usage of a defect-creating process of welding when mounting, which reduces a yield percentage of fit items when assembling and reliability in use, as a result increasing the labor content and cost price of manufacturing the IC module as a whole.

Moreover, a usage of a non-group welding process for multi-terminal chips brings to increasing the assembling time and increasing a probability of assembling machine malfunction, which influences negatively onto the assembly productivity and yield percentage of fit items, and consequently leads to raising the cost price of the single-chip module manufacture.

Moreover, the package structure is characterized by a complexity of the multilayer circuit structure of the intra-package wiring conductor system and by an uncontrollable influence of wiring conductors one on another, thereby great restrictions in the signal-to-noise ratio take place in transferring signals from contact pads of the chip to output terminals. As a result, frequency characteristics of such packages do not permit for chips mounted on the circuit board to interact at frequencies that are conceived for chips during their development and manufacture, and at admissible dissipation powers and heat loads on the chip.

At present time, package structures with output terminals as an array of terminals made in the form of balls (Ball Grid Array) get more and more wide usage. For multi-terminal IC chips, the ball output terminals of single-chip IC module packages being mounted on mating contact pads placed on the surface of the circuit printed board allow to solve, in principle, the terminal problem for modules having up to 1000 output terminals per package.

The most close to the present invention in the technical essence and obtained result when using is a single-chip IC module on a basis of a package including a header from ceramic in the form of a square plate with an IC chip placed in the central part of the header, which is separated from a cross-arm and film carrier of an intra-package wiring conductor system by a sidewall from an insulating material formed around the chip periphery, and serves for supporting wire couplers welded by their one ends to chip contact pads and by another ends to mating contacts of the cross-arm, the conductor system coupling contact pads of the cross-arm with output terminals of the package being one-layer, and at a periphery of the carrier the conductors are coupled with output terminals having a spherical form and placed on a carrier surface in several rows within a predetermined coordinate grid. The chip and cross-arm are separated from the output terminals by the sidewall of a rectangular shape viewed from the top, which sidewall is intended for a vacuum-tightened attachment of a cover ensuring a protection of the chip, cross-arm and welded wire elements from external influences (Texas Instruments Incorporated, Product Bulletin TMS320 C8x DSRs, Printed in USA by Regal Printing, Dallas, Tex., 1996).

Such implementation of the package ensures good electrodynamics and frequency characteristics of the intra-package wiring, since all conductors are placed in one layer, well thermo-mechanical characteristics (a resistance to raised temperatures and thermal cycles), well heat conduction of ceramic details, possibility for packaging great IC chips with a great number of contact pads and with a high heat release.

At the same time, this structure of the package has relatively big weight and sizes, a raised coefficient of thermal expansion, which creates problems in thermo-mechanical matching the package and circuit board, a high complexity and labor content in manufacturing the packages and their finish assembling including a mounting of the chips, a welding of the wire elements, a usage of the defect-creating non-group and low-productivity welding operation, which reduces significantly a yield percentage of fit items when assembling and reliability in use.

All enumerated disadvantages bring to a sharp increase of the module price for complicated multi-terminal IC's. Moreover, a great number of ball terminals attached to the mating contact pads of the circuit board by the <<flip-chip>> technique creates great difficulties in carrying out an inspection of the process and results of the module mounting on the circuit board and in ensuring the quality and reliability of couplings by the <<flip-chip>> technique.

SUMMARY OF THE INVENTION

The problem, for which solving the present invention is directed, is to provide a single-chip IC module free from disadvantages mentioned above and inherent to known technical decisions of the same purpose, which module's structure decisions eliminate technical and economical problems in development, manufacture, assembling and usage of such modules, and also remove restrictions on such technical characteristics being critical for known decisions as the clock frequency, number of output terminals and released heat removal.

The indicated technical result is attained owing to a fact that in the proposed single-chip IC module are used contact assemblies of an original structure, which ensure a reproducible and reliable electrical coupling between module elements at great number of output terminals; an original decision for intra-package wiring conductor system, which excludes the intermediate contacts in the form of the cross-arm; and also a usage of an original design of the module package and method for disposing in it the IC chip and other module elements.

The set problem is solved with an attainment of the mentioned technical result by that in a single-chip IC module comprising: a header with an IC chip disposed on it and having contact pads; a system of conductors coupling the IC chip contact pads, by means of elements of contact assemblies, with output terminals disposed around the header periphery within a predetermined coordinate grid; and a cover forming together with the header a closed volume for the chip, which is protected from external influences, in accordance with the invention, the header is made in the form of a flat plate on which are disposed a carrier with the IC chip fixed on it, a system of conductors made in the form of conducting paths on the carrier surface, connected with a metallized vias made in the carrier, some of which vias together with the IC chip contact pads form contact assemblies connecting the IC chip contact pads with the conductive paths on the carrier surface, and other metallized vias together with the output terminals made in the form of pins disposed with a gap in the metallized vias of the carrier form contact assemblies connecting the output terminals with the conductive paths on the carrier surface, the contacting assemblies elements being connected to one another with an electric-conductive binder, and the cover being made in the form of a plate having a hollow for the IC chip and vias around its periphery, through which are passed the output terminal pins, the plate together with the header forming the closed volume for the IC chip protected from external influences;

and also by that the metallized vias in the carrier for the contact assemblies connecting the IC chip contact pads with the conducting paths on the carrier surface are made in the form of frustrums of a cone or cylinders which bases faced to the IC chip contact pads form together with them joints filled with an electric-conductive binder, and which top bases have a metallized rings along their periphery coupled with the conducting paths;

and also by that the metallized vias in the carrier for contact assemblies connecting the conducting paths with the output terminal pins are made in the form of frustrums of cone or cylinders having metallized rings along their top and bottom butts, the top butts being coupled by the metallized rings around the periphery with the conducting paths, and the output terminal pins being disposed in the metallized vias with gaps filled with the electric-conductive binder;

and also by that the single-chip module comprises a frame disposed between the carrier and cover and made from an insulating material with a window for the chip and vias within the coordinate grid coincided with the coordinate grid of vias in the header, through which are passed the output terminal pins, and the cover is made in the form of a flat plate, the header, carrier, frame and cover are fitted tightly and fastened to one another;

and also by that conducting coatings insulated from each other are applied onto the top and bottom surfaces of the frame, and vias for the output terminal pins are metallized and have metallized rings, the first group of the metallized vias being insulated from the conducting coatings on both the top and bottom frame surfaces, the second group of the metallized vias being insulated from the conducting coating on the top frame surface and coupled electrically with the conducting coating on the bottom frame surface, and the third group of the metallized vias being insulated from the conducting coating on the bottom frame surface and coupled electrically with the conducting surface on the top frame surface, the conducting coatings on the top and bottom frame surfaces being used as supply or ground buses;

and also by that the header and cover are made from an electric-conducting material, and their surfaces and vias made in them are coated with an insulating material;

and also by that conducting coatings are applied onto the surfaces of the header and cover made from an insulating material, and vias for the output terminal pins made in the header and cover are metallized and insulated from the conducting coatings on the surfaces of the header and cover;

and also by that one group of the output terminal pins is coupled electrically with the conducting material of the header, another group of the output terminal pins is coupled with the conducting material of the cover, and the third group of the output terminal pins is insulated from both the header and cover;

and also by that the header is used as the ground bus and coupled electrically with the corresponding output terminal pins and IC chip contact pads, and the cover is used as the supply bus and coupled electrically with the corresponding output terminal pins and IC chip contact pads and vice versa;

and also by that the header and cover are used as a shield for protecting the IC chip from external electromagnetic fields and emissions, and also for protecting external components from the influence of the electromagnetic fields and emissions of the IC chip;

and also by that the cover is fitted tightly to the back side of the IC chip;

and also by that the carrier is made on the base from the polyimide film and as a multilayer one;

and also by that holes are made in the ends of the output terminals, opposite to the terminal ends interacting with the circuit board, a depth and diameter of which holes ensure their matching with mating terminals made in the form of pins;

and also by that a filler from an insulating material which can be heat-conducting is placed in the space of the closed volume for the IC chip;

an also by that free ends of the output terminal pins are made spherical, spaced at a predetermined distance from the package cover, and tinned by a solder.

DETAILED DESCRIPTION OF THE INVENTION

Figure 1:
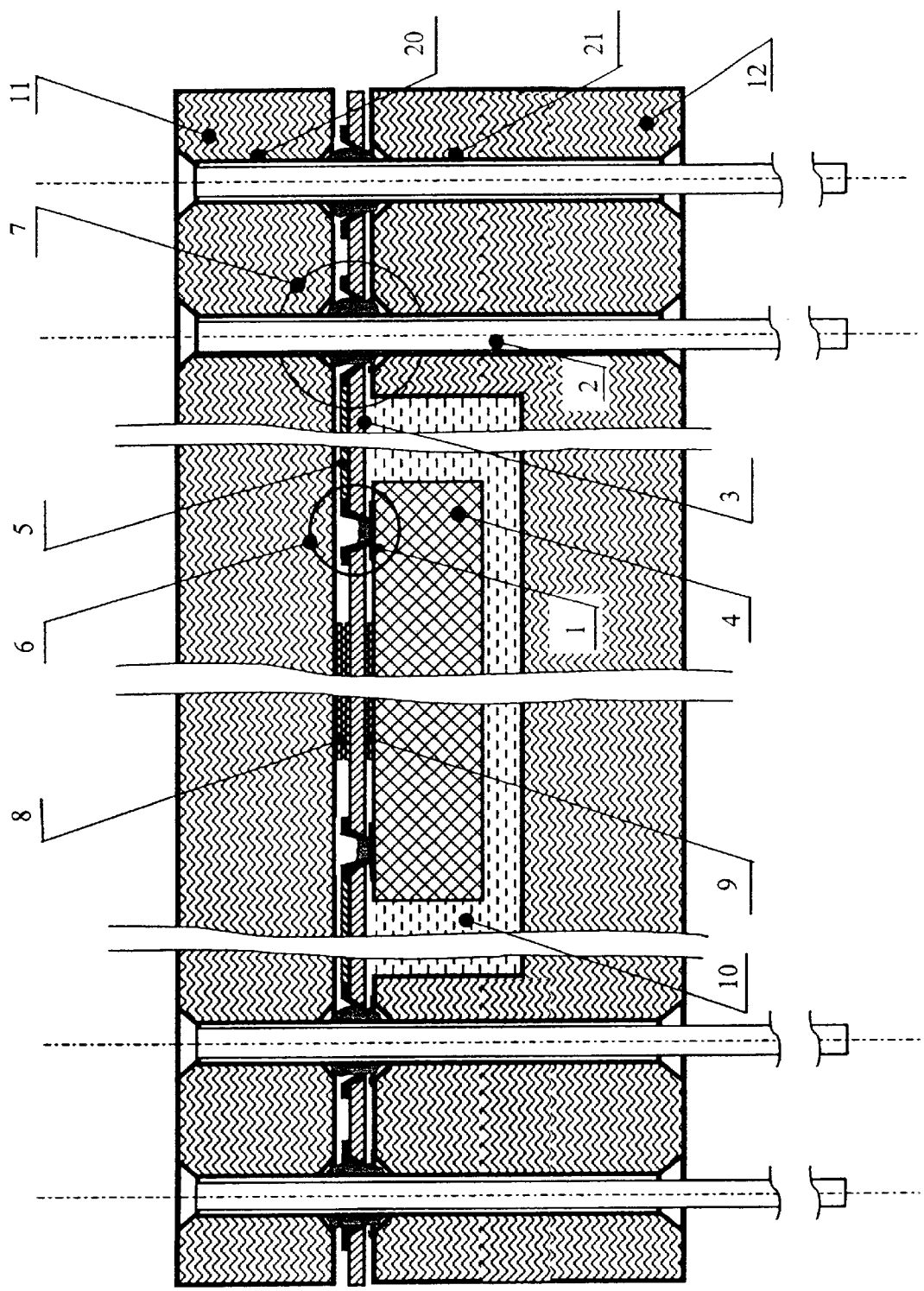
FIG. 1 shows the single-chip module with a cover having a hollow for placing the IC chip.

A single-clip module (FIG. 1) comprises a header 11 wherein output terminals 2 made in the form of pins are fixed in vias 20 disposed around the periphery of the header within a predetermined coordinate grid. A carrier 3 made from a insulating film material, as which a polyimide film can be used for example, is placed and fixed on the header from the side of the pins of output terminals 2 by means of an adhesive compound 8, for example. On the top surface of the carrier 3 conducting paths 5 are disposed, which are coupled electrically in the central part of the carrier with contact pads 1 of the chip 4 through original structure contact assemblies 6 formed within a coordinate grid of contact pads 1 of the chip 4. On the carrier periphery the metallized paths 5 are coupled with the pins of output terminals 2 through original contact assemblies 7 formed within the coordinate grid of pins. The chip 4 is attached to the bottom side of the carrier 3 by means of an adhesive compound 9, for example.

Pins of the output terminals 2 disposed on the header 11 are passed through vias 21 in a cover 12 pressed tightly to the carrier 3, which vias are made within the coordinate grid of vias 20 of the header 11. Sizes of the hollow in the central part of the cover 12 coincide to sizes of the chip 4. The header 11 and cover 12 form a closed volume for protecting an inner portion of the module with the chip 4 from external influences. Said volume is filled with a sealing compound 10 which ensures an additional protection of the chip 4 and improves module thermo-mechanical characteristics.

Figure 2:
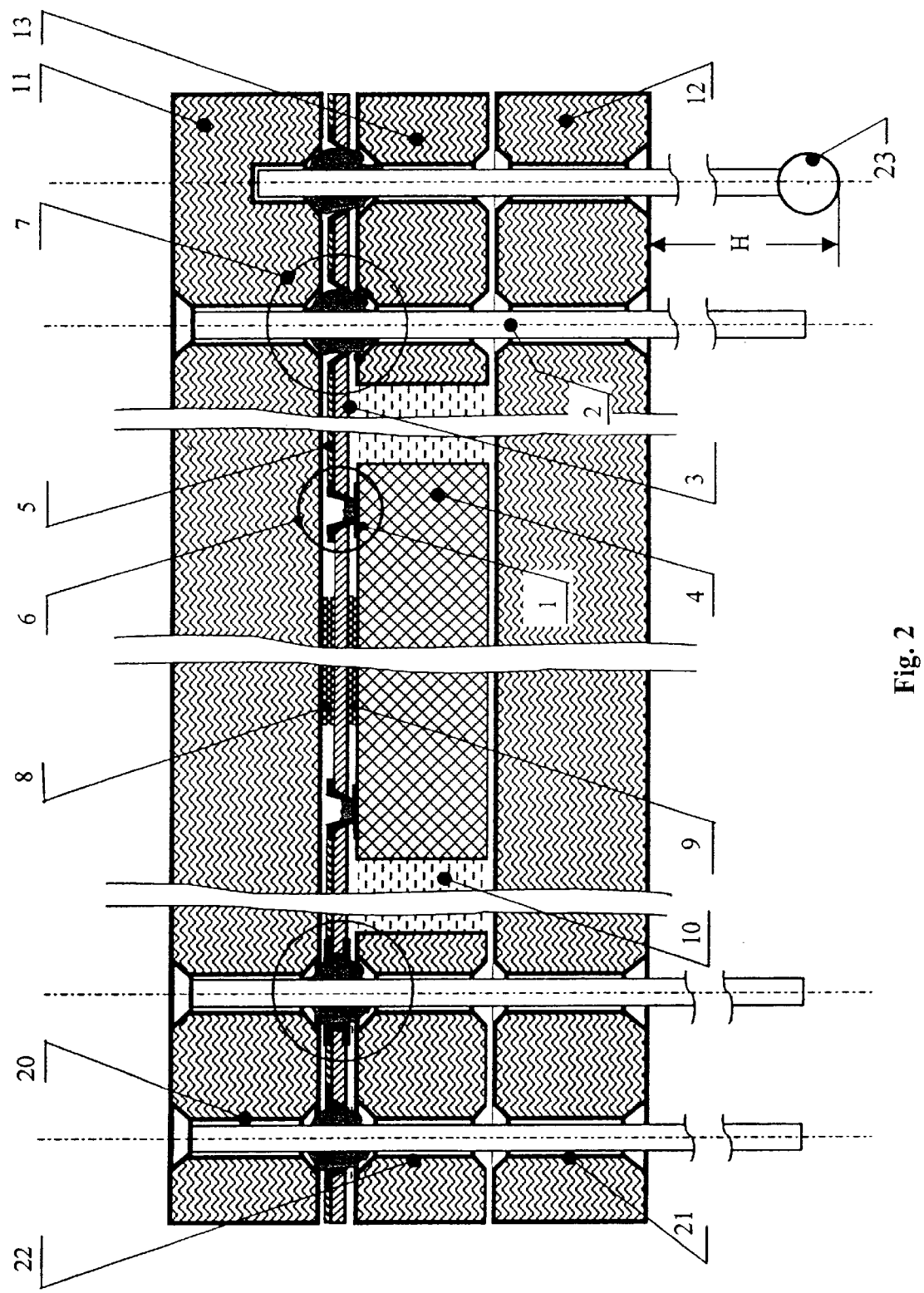
FIG. 2 shows the single-chip module with a cover consisting from two details: a frame and a flat cover.

FIG. 2 depicts an embodiment of the single-chip module wherein, for the purposes of improving an adaptability to manufacture the module, the cover is made from two details: the cover 12 itself in the form of a flat plate with vias 22 made within the coordinate grid of vias 20 of the header 11, and a frame 13 with a window for the chip 4 and with vias 21. Thus, not only the structure of the header and cover is unified, but it becomes possible, once making the header 11 and cover 12 from an electric- and heat-conducting material with an insulating coating and coupling electrically one group of the output terminal pins with the electric-conducting material of the header 11, the second group of pins with the electric-conducting material of the cover 12, and insulating the third group of pins from the header and cover, to use the header 11 and cover 12 simultaneously: as the <<ground>> and <<supply>> buses, as a shield from an external interference for the chip 4, and as heat release elements to release effectively the IC chip heat.

Free ends of the pin output terminals 2 can be made spherical 23. In order to facilitate the mounting of the module onto the board-carrier, the spherical ends 23 of the pins of the output terminals 2 can be disposed at the predetermined distance H from the package cover 12 and tinned by a solder.

Figure 3:
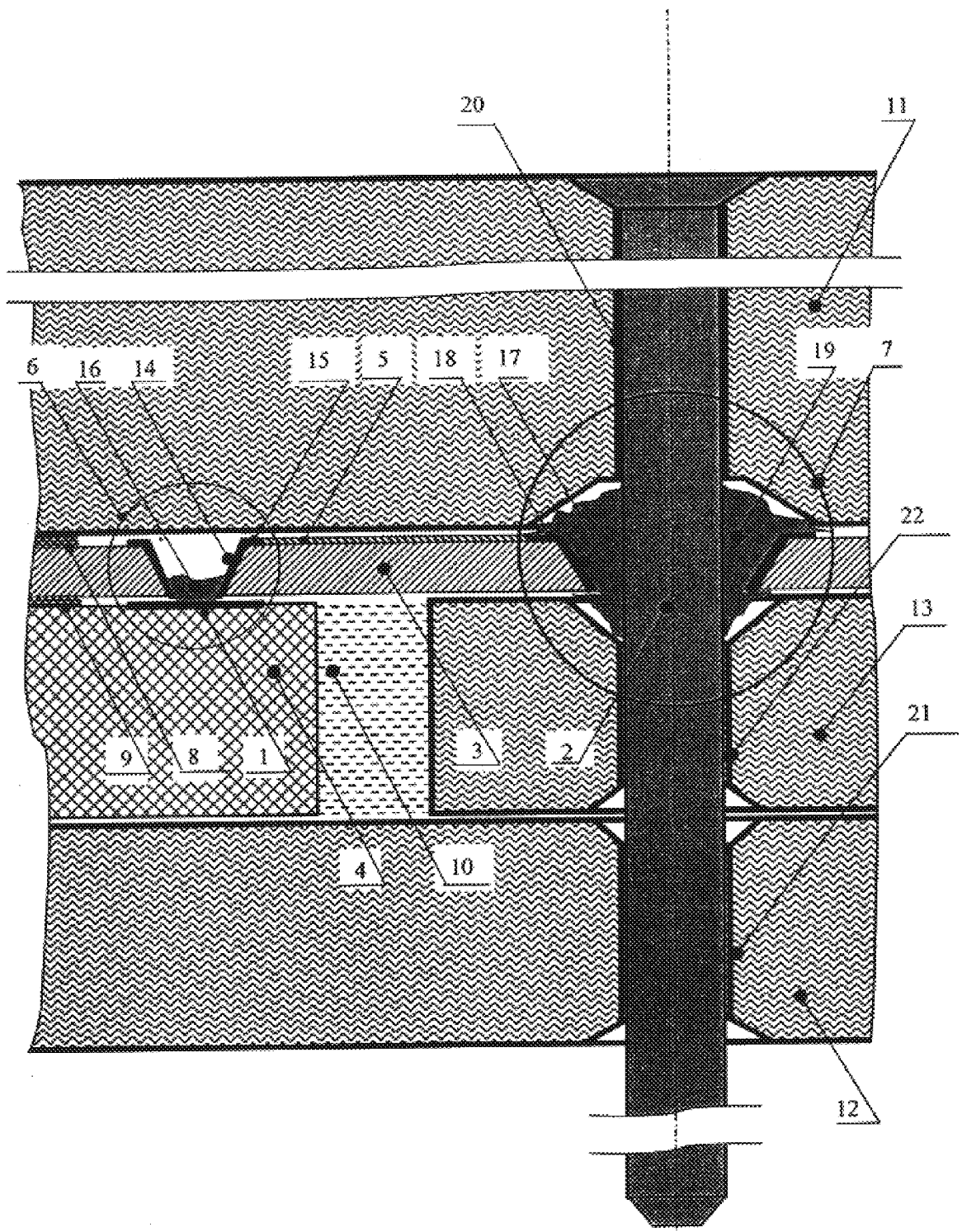
FIG. 3 shows the fragment of the single-chip module depicting a structure and interaction of elements of contact assemblies, the metallized via for the output terminal pin being made in the form of the frustrum of a cone.

FIG. 3 shows a fragment of the single-chip module with an enlarged image of the contact assemblies 6, 7 and conducting path 5.

Metallized vias 14 and 17 are made in the form of frustrums of a cone forming funnels for filling with an electric-conductive binder 16 and 19, respectively. Thus, a contacting area of elements of the contact assemblies 6 and 7 increases and, consequently, a reliability of the contact assemblies and operation of the single-chip module as a whole improves.

Figure 4:
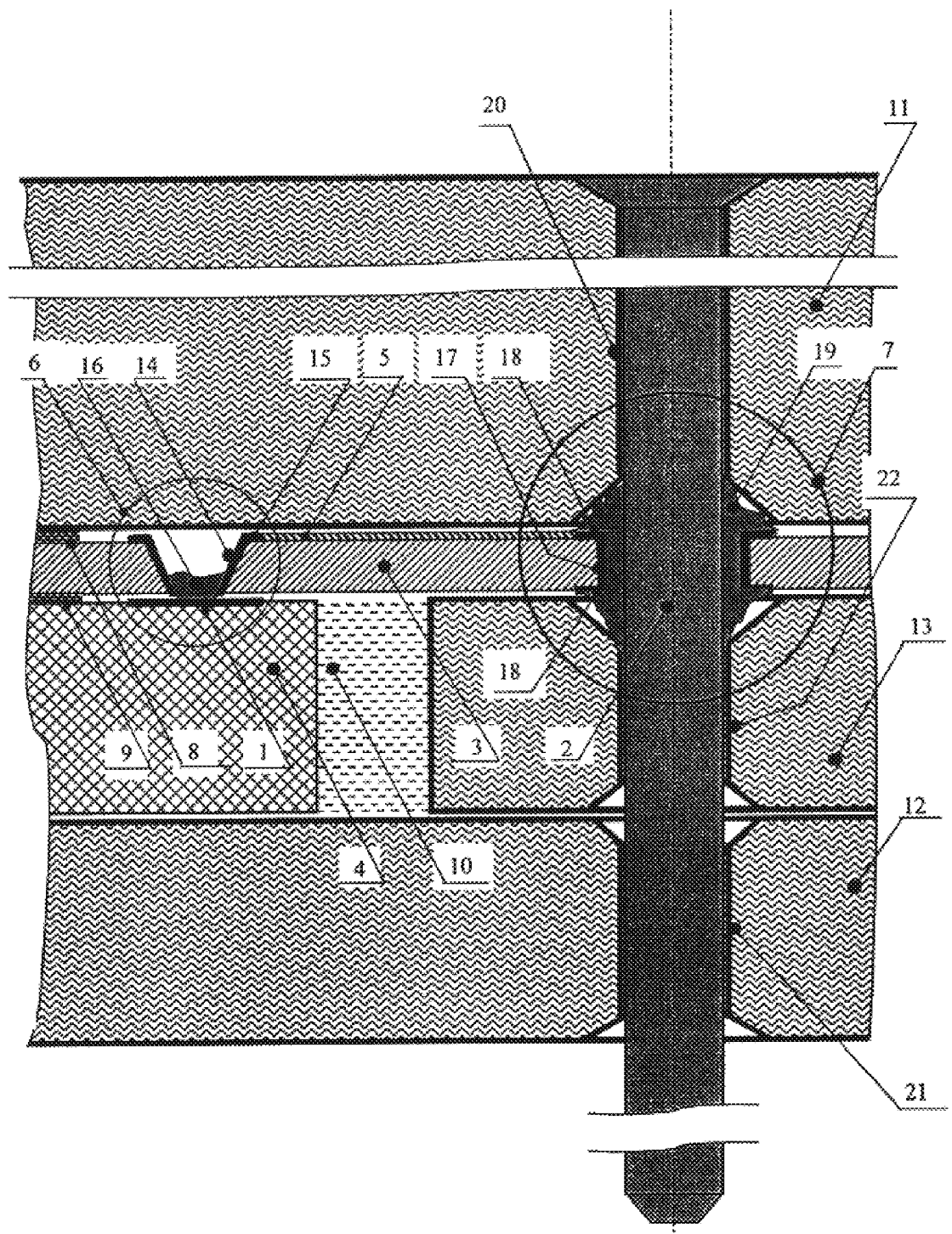
FIG. 4 is the same as FIG. 3, but the metallized via for the output terminal pin is made in the form of a cylinder.

FIG. 4 shows, as an example, a fragment of the single-chip module made with the metallized via 17 in the form of a cylinder having metallized rings 18 on the top and bottom surfaces of the carrier 3. The pin 2 of the output terminal is passed with a gap through the metallized via 17, and the gap itself is filled by the electric-conductive binder 19. Such form of the metallized via 17 ensures too a high reliability of the contact assembly 7.

Figure 5:
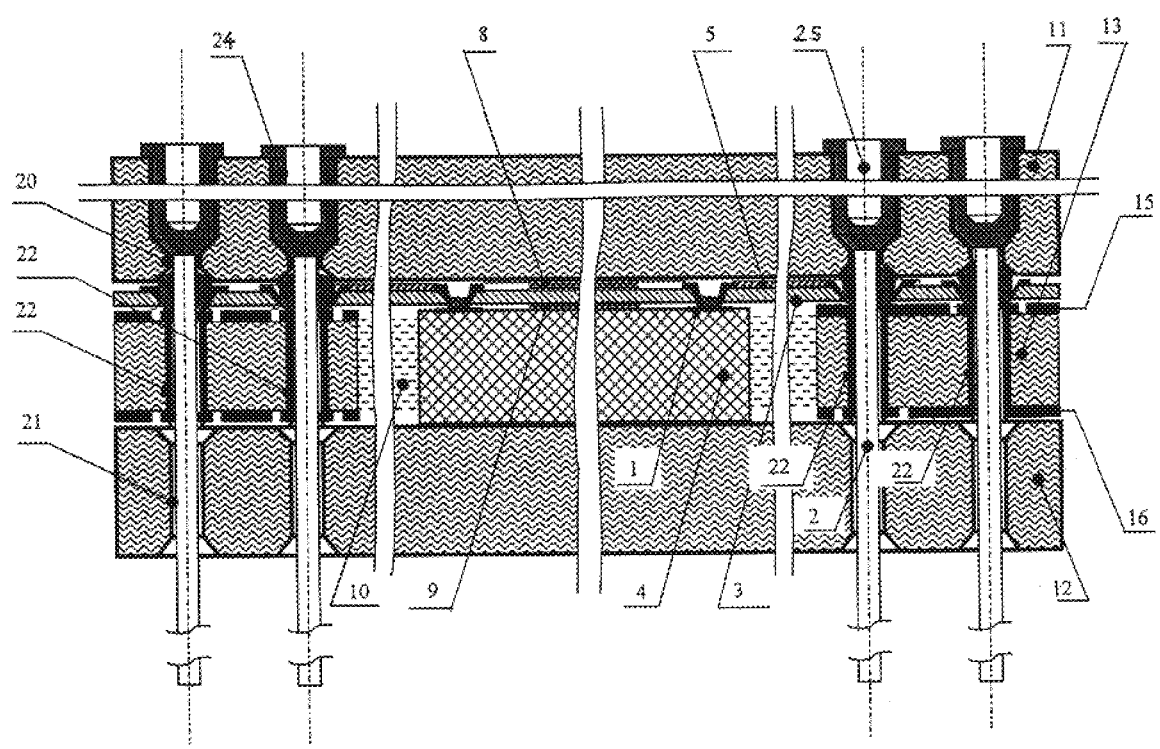
FIG. 5 shows the single-chip module where the cover is pressed tightly to the back side of the IC chip, the frame has <<ground>> and <<supply>> metallized surfaces, and top butts of the output terminal pins have axial holes for interacting with pin type terminals.

FIG. 5 illustrates the following possibilities of the single-chip module structure:

the frame 13 has metallized vias 22 within a coordinate grid, compatible with vias 20 and 21 for pins 2 of the output terminals in the header 11 and cover 12, one group of the metallized vias 22 being coupled electrically with only the electric-conductive coating 15 on the top surface of the frame 13, another group of vias 22 being coupled electrically with only the electric-conductive coating 16 on the bottom surface of the frame 13, and vias 22 of the third group being insulated from both the top 15 and bottom 16 electric-conductive coatings; thus, the top 15 and bottom 16 electric-conductive coatings of the frame 13 perform functions of the <<ground>> and <<supply>> and are coupled with the corresponding contact pads of the IC chip and output terminal pins, and the metallized vias 22 insulated from both coatings 15 and 16 in the frame 13 couple each other the signal contact pads of the chip with the corresponding output terminal pins; thereby improving essentially a quality of supplying the electric power to the chip and providing the more qualitative isolation of the signal conducting paths and <<ground>> and <<supply>> buses, which as a whole ensures the essential improvement of the frequency characteristics of the single-chip module;

the header 11 and cover 12 are made from the electric- and heat-conducting material with an electric insulating coating (for example, from the oxidized aluminum) and play the role of a shield protecting the IC chip from external electrical and radio interference, which shield has high heat characteristics in releasing the excess heat from the chip;

holes 25 can be made in bulges 24 at pin ends of the output terminals 2 from the side opposite to pin sections interacting with the circuit board, a depth and diameter of which holes coincide to mating contacts made in the form of pins;

the cover 12 is made from a heat-conducting material and pressed tightly to the back side of the IC chip, providing an additional heat removal from the IC chip;

the cavity in the insulated volume for the chip, created by the header 11, frame 13 and cover 12, is filled with a monolithic heat-conductive material 10, which improves essentially the protection of the chip 4 from climate influences and moisture, promotes to release an excess heat from the chip 4, and improves the thermo-mechanical and strength characteristics of the single-chip module.

Main elements and details of the single-chip module interact in the process of functioning as follows (taking FIG. 3 as example):

A signal from the contact pad 1 of the chip 4 passes through the electric-conductive binder 16, metallized via 14 and metallized ring 15 of the contact assembly 6, through the conducting path 5, through the metallized ring 18, metallized via 17 and electric-conductive binder 19 of the contact assembly 7 and comes to the pin of the output terminal 2, disposed in the via 17.

The single-chip IC module embodiment in accordance with the present invention allows to improve essentially the processing and performance characteristics of packaged IC, particularly to use chips of large dimensions having a great number of output terminals, to increase the noise immunity and frequency characteristics, to decrease the dimensions and weight, to reduce heat and thermo-mechanical loads onto the chip, to increase the IC service reliability, with the significant decrease of production costs by using group highly efficient, well controlled technological processes and operations with a low defect creation, which defines a high yield percentage of fit items and low cost of producing the single-chip modules (as compared with existing designs and technologies for packaging the IC's).

What is claimed is:

1. A single-chip integrated circuit (IC) module comprising:

a header with an IC chip disposed on it and having IC chip contact pads, the header shaped as a flat plate on which is disposed a carrier with the IC chip fixed on it;

a system of conductors formed as conducting paths on the carrier surface and being connected to metallized vias in the carrier, at least two of the vias and the IC chip contact pads forming contact assemblies connecting the IC chip contact pads with the conductive paths on the carrier, other metallized vias and output terminals formed as pins and disposed in gaps in the metallized vias of the carrier form contact assemblies connecting the output terminals with the conductive paths on the carrier surface, elements of the contacting assemblies being connected through an electrically conductive binder, the system of conductors coupling the IC chip contact pads through the elements of the contact assemblies to the output terminals disposed around the header within a predetermined coordinate grid; and a cover forming together with the header a closed volume for the IC chip, which is protected from external influences, the cover being shaped as a plate having a hollow for the IC chip and vias within a coordinate grid coinciding with a coordinate grid of vias in the header, through which are passed the output terminal pins, the plate together with the header forming the closed volume for the IC chip protected from external influences.

2. The single-chip IC module of claim 1 wherein the metallized vias in the carrier for the contact assemblies connecting the IC chip contact pads with the conducting paths on the carrier surface are shaped as frustums of a cone having small and large bases, wherein small bases face the IC chip contact pads and form together with them joints filled with an electrically conductive binder, and wherein large bases have metallized rings along peripheries coupled with the conducting paths.

3. The single-chip IC module of claim 1, wherein the metallized vias in the carrier for the contact assemblies connecting the IC chip contact pads with the conducting paths on the carrier surface are cylinder shaped with metallized rings along edges of butts, one of said butts coupled with the conducting paths and other butts forming joints with the IC chip contact pads filled with an electrically conductive binder.

4. The single-chip IC module of claim 1, wherein the metallized vias in the carrier for contact assemblies connecting the conducting paths with the output terminal pins are shaped as frustums of a cone having small and large bases, wherein large bases are coupled by the metallized rings around a periphery with the conducting paths, and small bases have metallized rings, and wherein the output terminal pins are disposed in the metallized vias with gaps filled with the electrically conductive binder.

5. The single-chip IC module of claim 1, wherein the metallized vias in the carrier for contact assemblies connecting the conducting paths with the output terminal pins are cylinder shaped having metallized rings along butts, top butts being coupled with the conducting paths on the carrier surface, and the output terminal pins being disposed in the metallized vias with gaps filled with the electrically conductive binder.

6. The single-chip IC module of claim 1, additionally comprising a frame disposed between the carrier and cover and made of insulating material, the frame having a window for the IC chip and vias for passing through the output terminal pins, the vias being arranged within a coordinate grid coinciding with the coordinate grid of vias in the header, the header, carrier, frame and cover being fitted tightly and fastened to one another.

7. The single-chip IC module of claim 6, wherein conducting coatings insulated from each other are applied onto top and bottom surfaces of the frame, and vias for the output terminal pins are metallized and have metallized rings, a first group of metallized vias being insulated from the conducting coatings on the top and bottom surfaces of the frame, a second group of metallized vias being insulated from the conducting coating on the top surface of the frame and electrically coupled with the conducting coating on the bottom surface of the frame, and a third group of metallized vias being insulated from the conducting coating on the bottom surface of the frame and electrically coupled with the conducting surface on the top surface of the frame, the conducting coatings on the top and bottom surfaces of the frame being one of supply and ground buses.

8. The single-chip IC module of claim 6, wherein the header and cover are made from an electrically conducting material and wherein the surfaces of the header and cover and vias existing therein being coated with an insulating material.

9. The single-chip IC module of claim 6, wherein conducting coatings are applied onto surfaces of the header and cover made of insulating material, and wherein vias for the output terminal pins existing in the header and cover are metallized and insulated from the conducting coatings on the surfaces of the header and cover.

10. The single-chip IC module of claim 8, wherein one group of the output terminal pins is electrically coupled with the conducting material of the header, a second group of the output terminal pins is coupled with the conducting material of the cover, and a third group of the output terminal pins is insulated from the header and cover.

11. The single-chip IC module of claim 8, wherein the header is a ground bus and electrically coupled with corresponding output terminal pins and IC chip contact pads, and the cover is a supply bus and electrically coupled with corresponding output terminal pins and IC chip contact pads.

12. The single-chip IC module of claim 8, wherein the header is a supply bus and electrically coupled with corresponding output terminal pins and IC chip contact pads, and the cover is a ground bus and electrically coupled with corresponding output terminal pins and IC chip contact pads.

13. The single-chip IC module of claim 8, wherein the header and cover shield the IC chip from external electromagnetic fields and emissions, and external components from influence of electromagnetic fields and emissions of the IC chip.

14. The single-chip IC module of claim 1, wherein the cover fits tightly to a back side of the IC chip.

15. The single-chip IC module of claim 1, wherein a base of the carrier includes a polyimide film.

16. The single-chip IC module of claim 1, wherein the carrier is a multilayer carrier.

17. The single-chip IC module of claim 1, wherein ends of the output terminals have holes opposite to the terminal ends interacting with the carrier, each hole having a depth and diameter matching with mating terminals in form of pins.

18. The single-chip IC module of claim 1, wherein the closed volume includes a filler of insulating material.

19. The single-chip IC module of claim 18, wherein the filler is a heat-conducting material.

20. The single-chip IC module of claim 1, wherein the header and cover are made from a material having a high heat conductivity.

21. The single-chip IC module of claim 1, wherein free ends of the output terminal pins are spherical.

22. The single-chip IC module of claim 21, wherein the spherical ends of the output terminal pins are spaced at a predetermined distance from the cover.

23. The single-chip IC module of claim 21, wherein surfaces of the spherical ends of the output terminal pins are tinned with solder.

* * * * *